(12) United States Patent
Yun et al.

(10) Patent No.: US 12,323,041 B2
(45) Date of Patent: Jun. 3, 2025

(54) VOLTAGE CONVERTER AND POWER MANAGEMENT DEVICE INCLUDING THE SAME

(71) Applicant: Samsung Electronics Co., Ltd., Suwon-si (KR)

(72) Inventors: Dam Yun, Suwon-si (KR); Haneul Kim, Suwon-si (KR); Dongwoo Baek, Suwon-si (KR); Jehyung Yoon, Seoul (KR); Sangik Cho, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/423,671

(22) Filed: Jan. 26, 2024

(65) Prior Publication Data

US 2024/0162802 A1 May 16, 2024

Related U.S. Application Data

(63) Continuation of application No. 18/298,496, filed on Apr. 11, 2023, now abandoned, which is a
(Continued)

(30) Foreign Application Priority Data

Jan. 30, 2020 (KR) .......................... 10-2020-0011350

(51) Int. Cl.
*H02M 3/158* (2006.01)
*H02M 1/00* (2006.01)

(52) U.S. Cl.
CPC ....... *H02M 1/0025* (2021.05); *H02M 1/0032* (2021.05); *H02M 3/158* (2013.01)

(58) Field of Classification Search
CPC .... H02M 3/156; H02M 3/158; H02M 1/0003; H02M 1/0025; H02M 1/0032
See application file for complete search history.

(56) References Cited

U.S. PATENT DOCUMENTS 8,842,225 B2   9/2014 Murakami et al.
8,872,497 B2   10/2014 Nakashima
(Continued)

FOREIGN PATENT DOCUMENTS

KR   10-0802918 B1   2/2008
KR   2015/0082009 A   7/2015
KR   2017/0123249 A   11/2017

OTHER PUBLICATIONS

Korean Office Action dated Aug. 21, 2024 for corresponding Korean Patent Application No. 10-2020-0011350 and its English-language translation.
(Continued)

*Primary Examiner* — Alex Torres-Rivera
(74) *Attorney, Agent, or Firm* — Harness, Dickey & Pierce, P.L.C.

(57) ABSTRACT

A voltage converter includes a converting circuit having an inductor connected to a switching node, a first switch element connected between the switching node and a ground voltage, and a second switch element connected between the switching node and an output node; and a switching control circuit configured to adjust a feedback voltage divided from an output voltage of the output node based on a current state of the inductor, and configured to generate switching control signals for charging the inductor with an input voltage and discharging a voltage charged in the inductor, based on a sensing signal based on a current of the inductor and the adjusted feedback voltage.

20 Claims, 13 Drawing Sheets

Related U.S. Application Data continuation of application No. 17/016,903, filed on Sep. 10, 2020, now Pat. No. 11,671,001.

(56) References Cited

U.S. PATENT DOCUMENTS

| | | |
|---|---|---|
| 9,058,043 B2 | 6/2015 | Lin et al. |
| 9,374,007 B2 | 6/2016 | Shiina et al. |
| 9,455,626 B2 | 9/2016 | Xue et al. |
| 9,641,076 B2 | 5/2017 | Kudo et al. |
| 9,647,541 B2 | 5/2017 | Fan |
| 9,768,695 B2 | 9/2017 | Nomiyama et al. |
| 9,866,115 B2 | 1/2018 | Jing et al. |
| 10,050,532 B2 | 8/2018 | Kawano et al. |
| 10,218,274 B1 | 2/2019 | Chan |
| 2011/0291626 A1* | 12/2011 | Murakami ............ H02M 3/156 323/271 |
| 2012/0274301 A1 | 11/2012 | Nakashima |
| 2013/0308061 A1* | 11/2013 | Murakami .......... H02M 3/1582 348/730 |
| 2014/0347027 A1 | 11/2014 | Jayaraj et al. |
| 2015/0091544 A1* | 4/2015 | Jayaraj .................. H02M 3/156 323/284 |
| 2015/0326123 A1 | 11/2015 | Fukushima et al. |
| 2017/0317589 A1 | 11/2017 | Kawano et al. |
| 2021/0050790 A1 | 2/2021 | Talari et al. |

OTHER PUBLICATIONS

Notice of Allowance dated Jan. 11, 2023, issued in corresponding U.S. Appl. No. 17/016,903.

* cited by examiner

VOLTAGE CONVERTER AND POWER MANAGEMENT DEVICE INCLUDING THE SAME

CROSS-REFERENCE TO RELATED APPLICATION

This is a continuation of U.S. application Ser. No. 18/298,496 filed Apr. 11, 2023, which is a continuation of U.S. application Ser. No. 17/016,903, filed Sep. 10, 2020, which claims priority to Korean Patent Application No. 10-2020-0011350, filed on Jan. 30, 2020, the disclosures of each of which are hereby incorporated by reference in their entirety.

BACKGROUND

1. Field

At least some example embodiments of the inventive concepts relate to a power supply device, and more particularly, to a voltage converter and a power management device including the same.

2. Related Art

An electronic circuit and an electronic device may include a power supply that converts a voltage input from the outside to supply a power voltage. In general, an electronic device includes a voltage converter used as a power supply, and particularly, may include a DC-DC converter having a relatively small size and high efficiency in order to efficiently supply a stable power voltage.

Moreover, a conventional boost converter may operate in a pulse frequency modulation (PFM) mode in a low load current region, and may operate in a pulse width modulation (PWM) mode in a high load current region in order to minimize efficiency degradation due to switching loss. However, undershoot occurs due to mode switching of the boost converter as described above, and thus, there is a problem in that the load transient characteristic is deteriorated. In order to solve the above-described problem, the boost converter is able to prevent an abrupt mode switching and secure a fast response characteristic by limiting the charging time of an inductor on an on-time basis, thereby securing an improved load transition characteristic. However, when the boost converter operates on-time, a problem may arise in operation stability when operating in a high load current region, and there is a difficulty in that the switching frequency is changed by an input voltage or an output voltage.

SUMMARY

One or more example embodiments of the inventive concepts provide a voltage converter and a power management device including the same to increase power transfer efficiency and stably perform mode switching while improving operation stability.

According to at least one example embodiment of the inventive concepts, a voltage converter includes a converting circuit having an inductor connected to a switching node, a first switch element connected between the switching node and a ground voltage, and a second switch element connected between the switching node and an output node; and a switching control circuit configured to adjust a feedback voltage divided from an output voltage of the output node based on a current state of the inductor, and configured to generate switching control signals for charging the inductor with an input voltage and discharging a voltage charged in the inductor, based on a sensing signal based on a current of the inductor and the adjusted feedback voltage.

According to at least one example embodiment of the inventive concepts, a voltage converter includes, a converting circuit having an inductor connected to a switching node, a first switch element connected between the switching node and a ground voltage, and a second switch element connected between the switching node and an output node; and a switching control circuit configured to adjust a feedback voltage derived from the output node, and configured to generate a first switching control signal provided to the first switch element for charging the inductor and a second switching control signal provided to the second switch element for discharging a voltage charged in the inductor, using the adjusted feedback voltage, wherein the switching control circuit further includes a ripple injection circuit configured to generate a reverse phase voltage of a voltage of the switching node, and configured to generate a ripple injection voltage for adjustment of the feedback voltage having the same phase as a current of the inductor using the reverse phase voltage.

According to at least one example embodiment of the inventive concepts, a power management device includes, a reference voltage generating circuit configured to generate a reference voltage; and a voltage converter configured to adjust a feedback voltage divided from an output voltage at an output node, perform pulse frequency modulation or pulse width modulation using the adjusted feedback voltage and the reference voltage to generate switching control signals, and convert an input voltage to the output voltage in response to the switching control signals, the voltage converter including a converting circuit having an inductor connected to an switching node, a first switch element connected to the switching node, and a second switch element connected between the switching node and the output node, the first switch element and the second switch element configured to switch for charging the inductor with the input voltage and discharging a voltage charged the inductor in response to the switching control signals; and a switching control circuit configured to generate a ripple injection voltage having the same phase as a current of the inductor, adjust the feedback voltage using the ripple injection voltage, and generate the switching control signals using the adjusted feedback voltage.

According to at least one example embodiment of the inventive concepts, a voltage converter includes a converting circuit including an inductor connected to a switching node, a first switch element connected between the switching node and a ground voltage, and a second switch element connected between the switching node and the output node, the first switch element and the second switch element configured to switch for charging the inductor with the input voltage and discharging a voltage charged to the inductor; and a switching control circuit configured to generate switching control signals for controlling the first switch element and the second switch element, the switching control circuit including a ripple injection circuit configured to generate a ripple injection voltage having the same phase as a current of the inductor using an output voltage of the output node and the switching control signals, the switching control circuit further configured to adjust a feedback voltage derived from the output node using the ripple injection voltage, and perform a first comparison based on the adjusted feedback voltage and a reference voltage to generate the switching control signals.

BRIEF DESCRIPTION OF THE DRAWINGS

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

DETAILED DESCRIPTION

Hereinafter, at least some example embodiments of the inventive concepts will be described in detail with reference to the accompanying drawings.

Figure 1:
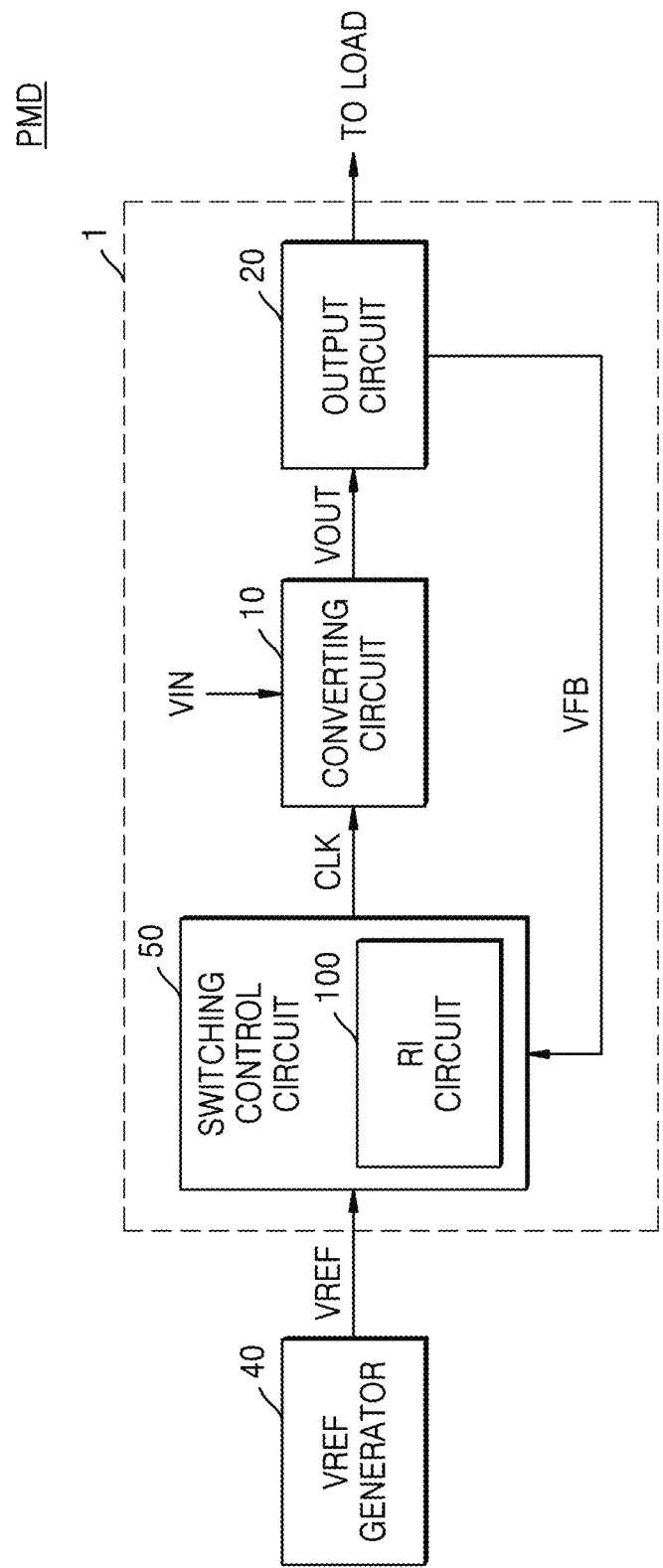
FIG. 1 is a block diagram illustrating a power management device according to at least one example embodiment of the inventive concepts.

FIG. 1 is a block diagram illustrating a power management device according to at least one example embodiment of the inventive concepts.

Referring to FIG. 1, a power management device PMD may include a reference voltage generation circuit 40 and a voltage converter 1. The reference voltage generation circuit 40 may generate a reference voltage VREF in response to a reference or, alternatively, predetermined enable signal. According at least one example embodiment of the inventive concepts, the reference voltage generation circuit 40 may be implemented in the form of a voltage division circuit using distribution resistors, and in the form of a band-gap reference circuit that provides a stable reference voltage VREF insensitive to temperature changes. Although not illustrated in FIG. 1, when implemented as the band-gap reference circuit, the reference voltage generation circuit 40 may include a start-up circuit, a plurality of PMOS transistors, a plurality of resistance elements, and the like.

The voltage converter 1 may include a switching control circuit 50, a converting circuit 10, and an output circuit 20. Hereinafter, the voltage converter 1 may be referred to as a switching mode power supply or a power converter. In addition, the voltage converter 1 is mainly described as operating as a boost converter, but the technical idea of the present disclosure is not limited thereto. The switching control circuit 50 may generate at least one switching control signal SWCS for controlling the converting circuit 10. The converting circuit 10 may convert an input voltage VIN into an output voltage VOUT by repeatedly charging and discharging an inductor in the converting circuit 10 in response to at least one switching control signal SWCS. The output circuit 20 may provide a load current based on the output voltage VOUT to the load. The output circuit 20 may provide the switching control circuit 50 with a feedback voltage VFB that is distributed and output based on the output voltage VOUT as an input.

The switching control circuit 50 according to at least one example embodiment of the inventive concepts may adjust the feedback voltage VFB to generate at least one switching control signal SWCS based on the adjusted feedback voltage. The switching control circuit 50 may include a ripple injection circuit 100, and the ripple injection circuit 100 may generate a ripple injection voltage based on the state of the current flowing through the inductor of the converting circuit 10. In detail, the ripple injection voltage may have the same phase as the current of the inductor, and the switching control circuit 50 may adjust the feedback voltage VFB by adding the ripple injection voltage from which the DC component is removed to the feedback voltage VFB.

Moreover, the switching control circuit 50 according to at least one example embodiment of the inventive concepts may limit the charging time of the inductor of the converting circuit 10 on the basis of on-time. In order to limit the charging time of the inductor, the switching control circuit 50 may generate an on-time control signal based on the DC component of the ripple injection voltage. The DC component of the ripple injection voltage is based on the duty ratio of a voltage of a switching node connected to the inductor of the converting circuit 10. In detail, the DC component of the ripple injection voltage may be proportional to the duty ratio of the reverse phase voltage to the voltage of the switching node. The switching control circuit 50 generates an on-time control signal using the DC component of the ripple injection voltage, thereby preventing the switching frequency of the voltage converter 1 from being changed by the input voltage VIN, the output voltage VOUT, and the output current. The switching control circuit 50 may generate at least one switching control signal SWCS based on the on-time control signal and the adjusted feedback voltage.

The voltage converter 1 or the power management device PMD according to at least one example embodiment of the inventive concepts of the present disclosure may satisfy a desired or, alternatively, predetermined condition for securing operational stability by adjusting the feedback voltage VFB using the ripple injection voltage from which the DC component is removed and then generating at least one switching control signal SWCS, and may fix the switching frequency within a desired or, alternatively, predetermined range by generating an on-time control signal using the DC component of the ripple injection voltage.

Figure 2:
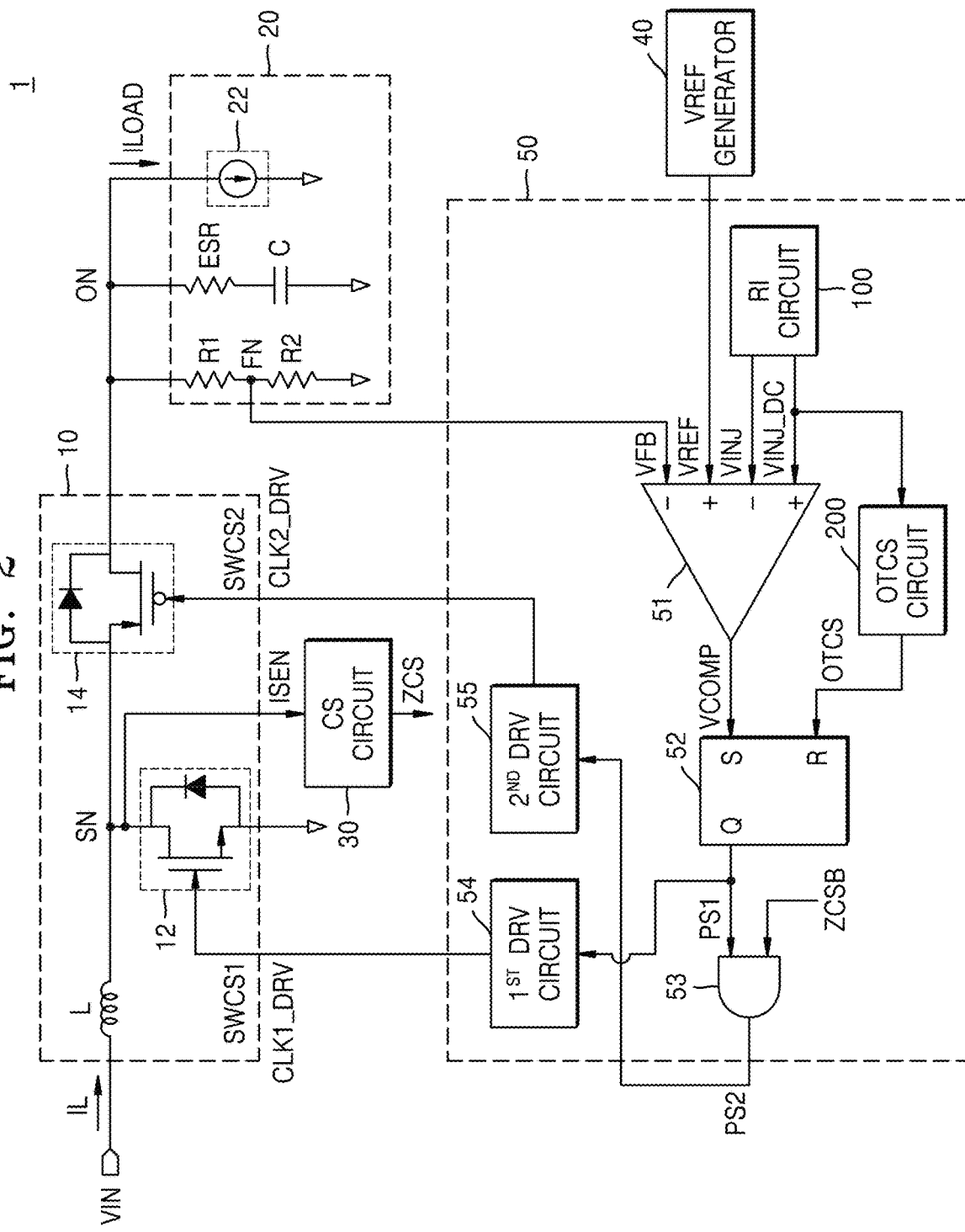
FIG. 2 is a block diagram showing a voltage converter according to at least one example embodiment of the inventive concepts.

FIG. 2 is a block diagram showing the voltage converter according to at least one example embodiment of the inventive concepts. The configuration of the voltage converter described below is one example. The voltage converter may be implemented in various configurations capable of adjusting the feedback voltage VFB based on the state of an inductor current IL and generating an on-time control signal OTCS, based on a DC component based on the duty ratio of the voltage of the switching node SN.

Referring to FIG. 2, the voltage converter 1 may include a converting circuit 10, an output circuit 20, a current sensing circuit 30, and a switching control circuit 50. The converting circuit 10 may include an inductor L, a first switch element 12, and a second switch element 14. The first switch element 12 may be an n-channel power switch connected between the switching node SN and a ground voltage, and the second switch element 14 may be implemented as a p-channel power switch connected between the switching node SN and an output node ON, which will be described later in detail.

The output circuit 20 may include feedback resistor elements R1 and R2, an effective series resistance component ESR, an output capacitor C, and a load 22. The load 22 shown in FIG. 2 is illustrated for convenience of description, and the voltage converter 1 in another example embodiment of the inventive concepts may not include the load 22. The feedback resistor elements R1 and R2 are connected through a feedback node FN and divide the output voltage VOUT of an output node ON to output the feedback voltage VFB. The effective series resistance component ESR and the output capacitor C may be connected in series. The feedback resistor elements R1 and R2 may be connected in parallel with the effective series resistance component ESR and the output capacitor C between the output node ON and the ground voltage. A load current ILOAD may be provided from the output node ON to the load 22. The inductor L and the output capacitor C may function as a low-pass filter that eliminates ripple of the output voltage VOUT.

The first switch element 12 and the second switch element 14 may charge the inductor L with the input voltage VIN or transfer the voltage charged in the inductor L to the output node ON, in response to a first switching control signal SWCS1 and a second switching control signal SWCS2, respectively, The first switch element 12 may include an n-channel power switch having a drain connected to the switching node SN, a source connected to the ground voltage, and a gate to which the first switching control signal SWCS1 is applied The second switch element 14 may include a p-channel power switch having a source connected to the switching node SN, a drain connected to the output node ON, and a gate receiving the second switching control signal SWCS2.

The current sensing circuit 30 may output a sensing signal ZCS indicating whether a sensing current ISEN is at a zero level (or 0 [A]) based on the sensing current ISEN flowing to the first switch element 12. Although not illustrated in FIG. 2, the current sensing circuit 30 may further generate a level-sensing signal indicating the level of the sensing current ISEN based on the sensing signal ZCS. The reference voltage generation circuit 40 may generate a reference voltage VREF required to generate the first switching control signal SWCS1 or the second switching control signal SWCS2.

The switching control circuit 50 may generate first and second switching control signals SWCS1 and SWCS2 by performing pulse width modulation PWM or pulse frequency modulation PFM based on the detection signal ZCS, the feedback voltage VFB, a ripple injection voltage VINJ, and a DC component of the ripple injection voltage VINJ_DC, and may adjust a charging time of the inductor L using the input voltage VIN based on time.

The switching control circuit 50 may include a ripple injection circuit 100, an on-time control circuit 200, a comparator 51, a set & reset (SR) latch 52, a logic gate 53, a first driving circuit 54, and a second driving circuit 55. The ripple injection circuit 100 may generate a ripple injection voltage VINJ having the same phase as the inductor current IL flowing through the inductor L and generate the DC component of the ripple injection voltage VINJ_DC. The switching control circuit 50 may sum the ripple injection voltage VINJ from which the DC component VINJ_DC is removed, and the feedback voltage VFB. The comparator 51 may compare the summed voltage with the reference voltage VREF to generate a comparison result signal VCOMP.

The on-time control circuit 200 may receive the DC component VINJ_DC from the ripple injection circuit 100, and generate an on-time control signal OTCS for limiting the charging time of the inductor L based on the received DC component VINJ_DC. In detail, the on-time control circuit 200 may compare the DC component VINJ_DC with a ramp voltage generated from the output voltage VOUT of the output node ON, and may generate an on-time control signal OTCS for setting an on-time period (or on-time) proportional to a duty ratio of a reverse phase to a voltage of the switching node SN based on a result of the comparison. For example, the switching control circuit 50 may compare the adjusted feedback voltage with the reference voltage VREF, and then may charge the inductor L during the on-time period when the adjusted feedback voltage is lower than the reference voltage VREF. After the on-time period according to the on-time control signal OTCS, the switching control circuit 50 may repeatedly perform an operation of charging the output capacitor C by transferring the voltage charged in the inductor L to the output node ON.

The SR latch 52 may receive the comparison result signal VCOMP as the set S and the on-time control signal OTCS as the reset R. The SR latch 52 may output a signal Q (hereinafter, the first pulse signal PS1) based on a comparison result signal VCOMP in an on-time period in which the on-time control signal OTCS has a desired or, alternatively, predetermined level. The first pulse signal PS1 may be provided to both the logic gate 53 and the first driving circuit 54. The first driving circuit 54 may amplify the first pulse signal PS1 and provide the amplified first pulse signal to the first switch element 12 as the first switching control signal SWCS1. The logic gate 53 may further receive an inverted sensing signal ZCSB and may provide the second driving circuit 55 with the second pulse signal PS2 generated by performing an AND operation on the inverted sensing signal ZCSB and the first pulse signal PS1. The second driving circuit 55 may amplify the second pulse signal PS2 and provide the amplified second signal to the second switch element 14 as the second switching control signal SWCS2.

Figure 3A:
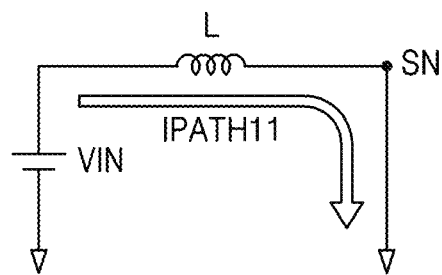
FIGS. 3A and 3B are diagrams illustrating the operation of the converting circuit of the voltage converter of FIG. 2.
Figure 3B:
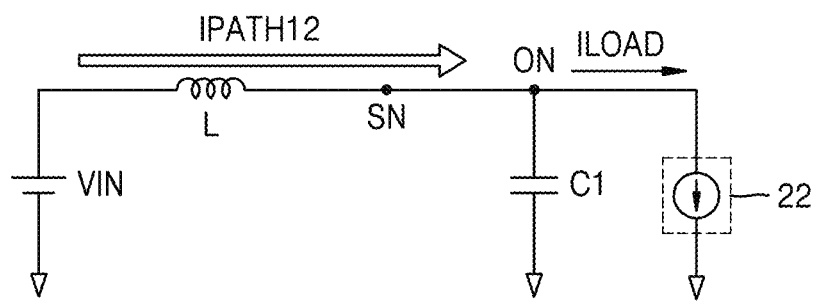

FIGS. 3A and 3B are diagrams illustrating the operation of the converting circuit of the voltage converter of FIG. 2.

Referring to FIGS. 2 and 3A, when the first switch element 12 is turned on and the second switch element 14 is turned off in response to the first and second switching control signals SWCS1 and SWCS2, the converting circuit 10 may perform a current build-up operation to store the input voltage VIN in the inductor L. When the converting circuit 10 performs a current build-up operation, a first current path IPATH11 is formed, and the inductor current IL flowing through the inductor L may be substantially the same as the sensing current ISEN.

Referring to FIGS. 2 and 3B, when the first switch element 12 is turned off and the second switch element 14 is turned on in response to the first and second switching control signals SWCS1 and SWCS2, the converting circuit 50 may perform a current transfer operation to transfer energy stored in the inductor L to the output node ON. When the converting circuit 50 performs a current transfer operation, a second current path IPATH12 is formed, and a load current ILOAD may be provided to the load 22.

Figure 4:
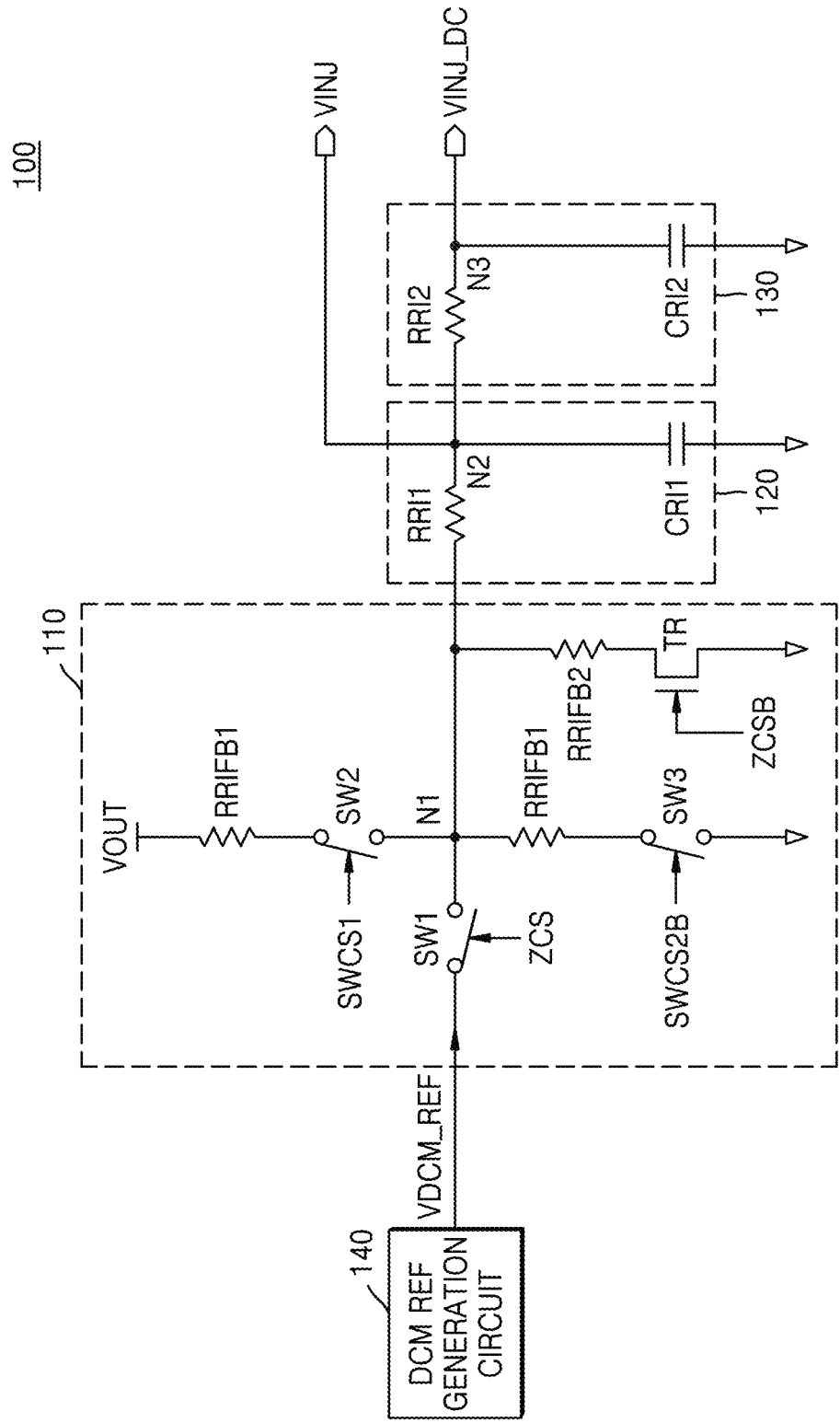
FIG. 4 is a circuit diagram illustrating a ripple injection circuit of FIG. 2 according to at least one example embodiment of the inventive concepts.
Figure 5:
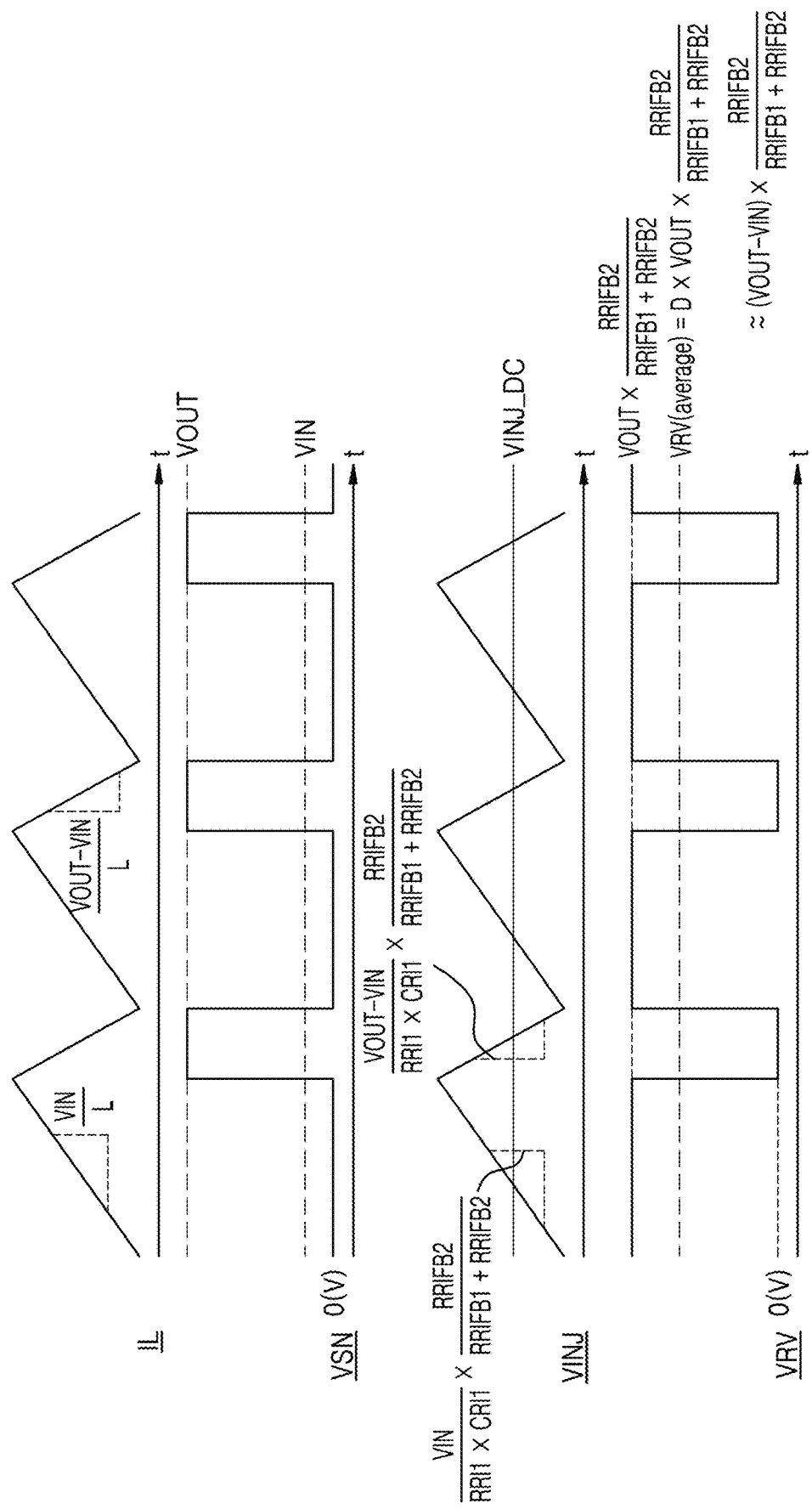
FIG. 5 is a timing diagram for explaining the operation of the ripple injection circuit.
Figure 6:
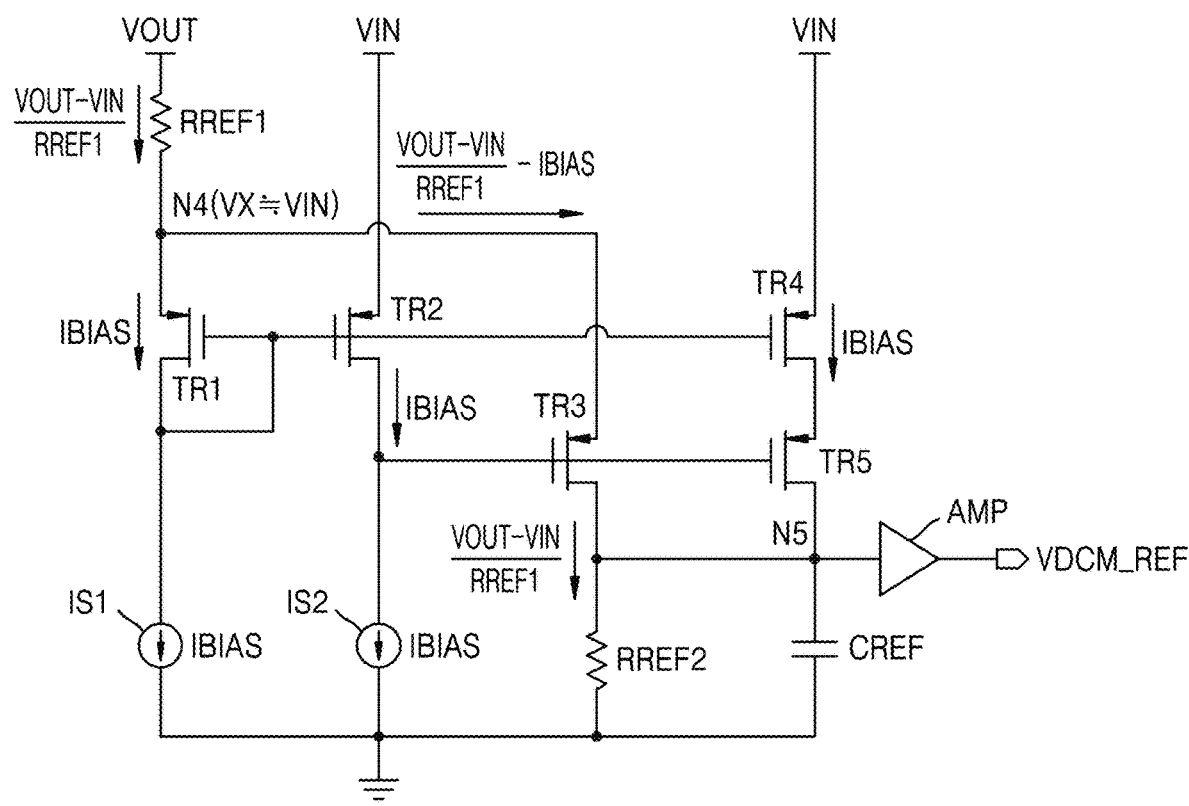
FIG. 6 is a circuit diagram illustrating a DCM reference voltage generation circuit shown in FIG. 4.

FIG. 4 is a circuit diagram illustrating the ripple injection circuit of FIG. 2 according to at least one example embodiment of the inventive concepts, FIG. 5 is a timing diagram for explaining the operation of the ripple injection circuit, and FIG. 6 is a circuit diagram illustrating a DCM reference voltage generation circuit shown in FIG. 4.

Referring to FIG. 4, the ripple injection circuit 100 may include a reverse phase voltage generation circuit 110, a first stage circuit 120, a second stage circuit 130, and a discontinuous conduction mode (DCM) reference voltage generation circuit 140. The reverse phase voltage generation circuit 110 may include first to third resistance elements RRIFB1 to RRIFB2, third to fifth switch elements SW1 to SW3, and an NMOS transistor TR. The third switch element SW1 may be connected between a first internal node N1 and the DCM reference voltage generating circuit 140, a fourth switch element SW2 may be connected between the first resistor element RRIFB1 and the first internal node N1, and a fifth switch element SW3 may be connected between the second resistor element RRIFB1 and the ground voltage. The drain of the NMOS transistor TR may be connected to the third resistor element RRIFB2, and the source of the NMOS transistor TR may be connected to the ground voltage. The reverse phase voltage generation circuit 110 may receive a DCM reference voltage VDCM_REF from the DCM reference voltage generation circuit 140 through the third switch element SW1, and receive the output voltage VOUT from the output node ON (FIG. 2) through the fourth switch element SW2.

The first stage circuit 120 may include a fourth resistor element RRI1 and a first capacitor CRI1. The fourth resistor element RRI1 is connected between the first internal node N1 and a second internal node N2 of the reverse phase voltage generation circuit 110, and the first capacitor CRI1 may be connected between the second internal node N2 and the ground voltage. The first stage circuit 120 may be referred to as an RC filter, receive the reverse phase voltage from the reverse phase voltage generation circuit 110, and output the ripple injection voltage generated through the second internal node N2 (VINJ) by filtering the reverse phase voltage.

A second stage circuit 130 may include a fifth resistor element RRI2 and a second capacitor CRI2. The fifth resistor element RRI2 is connected between the second internal node N2 of the first stage circuit 120 and a third internal node N3, and the second capacitor CRI2 may be connected between the third internal node N3 and the ground voltage. The second stage circuit 130 may be referred to as an RC filter, receive a ripple injection voltage VINJ from the first stage circuit 120, and output the DC component VINJ_DC of the ripple injection voltage VINJ extracted through the third internal node N3.

Moreover, in order to secure improved stability, the voltage converter 1 of FIG. 2 must satisfy the following condition indicated by Equation 1. Hereinafter, reference numerals indicating the elements may be used interchangeably as indicating specific values of the corresponding elements.

$$ESR > \frac{L}{C} \times \frac{ILOAD}{VIN} \quad \text{[Equation 1]}$$

In order for the voltage converter 1 to secure improved stability, referring to FIG. 2, the resistance value of the ESR component ESR must satisfy Equation 1 expressed by a relational expression of an inductance of the inductor L, a capacitance of an output capacitor C, a load current ILOAD, and an input voltage VIN. However, there has been a problem that the output capacitor C that does not satisfy the condition indicated by Equation 1 is mainly used, because the ripple of the output voltage VOUT of the output node ON becomes large when the resistance value of the ESR component ESR increases, The technical idea of the present disclosure may adjust the feedback voltage VFB to satisfy the condition indicated by Equation 1 even when the resistance value of the ESR component ESR is small.

The output voltage of the output node ON may be expressed as Equation 2 below.

$$VOUT = VC + ESR \times IC \quad \text{[Equation 2]}$$

The output voltage VOUT of the output node ON may be a sum of the voltage across a voltage VC of the output capacitor C and a voltage across the ESR component ESR, and the voltage across the ESR component ESR may be expressed as a product of the resistance value of the ESR component ESR and a capacitor current IC flowing through the output capacitor C. On the other hand, the capacitor current IC may be obtained by subtracting the load current ILOAD from the inductor current IL, because the comparison timing in the comparator 51 is mostly a period in which a voltage charged in the inductor L is discharged. Therefore, when the information on the inductor current IL is reflected in the feedback voltage VFB, it may have the same effect as having the resistance value of the ESR component ESR greater than the resistance value represented by Equation 1, and accordingly, the voltage converter 1 may have improved stability.

Referring to FIG. 5, the reverse phase voltage generation circuit 110 may generate a voltage VRV in which the phase of the voltage VSN at the switching node SN is inverted. In detail, the reverse phase voltage generation circuit 110 may be turned off, in a Continuous Conduction Mode (CCM) by the fourth switch element SW2 receiving the first switching control signal SWCS1, the fifth switch element SW3 receiving an inverted second switching control signal SWCS2B, and the third switch element SW1 receiving a low-level sensing signal ZCS. Also, the NMOS transistor TR may receive a high-level inverted sensing signal ZCSB through the gate.

Through the above-described control, the reverse phase voltage generation circuit 110 may generate the maximum reverse phase voltage VRV (MAX) represented by Equation 3 at the first internal node N1.

$$VRV(MAX) = VOUT \times \frac{RRIFB2}{RRIFB1 + RRIFB2} \quad \text{[Equation 3]}$$

On the other hand, an average reverse phase voltage VRV (average) may be expressed as the following Equation 4.

$$VRV(\text{average}) = D \times VOUT \times \frac{RRIFB2}{RRIFB1 + RRIFB2} \approx \quad \text{[Equation 4]}$$
$$(VOUT - VIN) \times \frac{RRIFB2}{RRIFB1 + RRIFB2}$$

The average reverse phase voltage VRV (average) may be expressed as a product of a duty ratio D of the reverse phase voltage VRV and the maximum reverse phase voltage VRV (MAX), and the duty ratio D of the reverse phase voltage VRV and a duty ratio D 'of the switching node voltage VSN may be expressed by a relationship such as D=1−D'. That is, the duty ratio D of the reverse phase voltage VRV may be determined depending on the duty ratio D 'of the switching node voltage VSN. In the switching node voltage VSN, the output voltage VOUT and the input voltage VIN may have a relationship expressed by an equation VIN=VOUT×D'. Therefore, the product of the duty ratio D of the reverse phase voltage VRV and the output voltage VOUT may be the same or approximate to the value obtained by subtracting the input voltage VIN from the output voltage VOUT.

The inductor current IL may have a slope corresponding to $$\frac{VIN}{L}$$

in the charging period of the inductor L, and may have a slope corresponding to $$\frac{VOUT - VIN}{L}$$

in the discharge period of the inductor L. The ripple injection circuit 100 may pass a reverse phase voltage VRV through the first stage circuit 120 to generate a ripple injection voltage VINJ having the same phase as the inductor current IL. The ripple injection voltage VINJ may have a slope corresponding to $$\frac{VIN}{RRI1 \times CRI1} \times \frac{RRIFB2}{RRIFB1 + RRIFB2}$$

in the charging period of the inductor L, and have a slope corresponding to $$\frac{VOUT - VIN}{RRI1 \times CRI1} \times \frac{RRIFB2}{RRIFB1 + RRIFB2}$$

in the discharge period of the inductor L. Moreover, each resistance value of the first to fourth resistance elements RRIFB1, RRIFB2, and RRI1 and the capacitance of the first capacitor CRI1 may be determined or, alternatively, predetermined so that the ripple injection voltage VINJ is in the same phase as the inductor current IL. For example, the first resistance element and the second resistance element RRIFB1 may have the same resistance value, and the third resistance element RRIFB2 may have a different resistance value from the first resistance element and the second resistance element RRIFB1.

Moreover, the ripple injection voltage VINJ may include not only the AC component but also the DC component VINJ_DC. In addition, the ripple injection circuit 100 may extract the DC component VINJ_DC by passing the ripple injection voltage VINJ through the second stage circuit 130, because the DC component VINJ_DC may cause an offset of the output voltage VOUT. The feedback voltage VFB may be adjusted by adding the ripple injection voltage VINJ from which the DC component VINJ_DC is removed to the feedback voltage VFB.

As described above, when a voltage conversion operation based on the feedback voltage VFB adjusted through the operation of the ripple injection circuit 100 is performed, a virtual resistance value of the ESR component ESR may be defined by the following Equation 5 from the viewpoint of the switching control circuit 50.

$$ESR(\text{VIRTUAL}) = \quad \text{[Equation 5]}$$
$$\frac{L}{RRI1 \times CRI1} \times \frac{R1 + R2}{R2} \times \frac{RRIFB2}{RRIFB1 + RRIFB2}$$

The resistance value of the fourth resistance element RRI1 and the capacitance of the first capacitor CRI1 may be determined or, alternatively, predetermined so that the virtual resistance value of the ESR component ESR meets the condition indicated by Equation 1. One or more example embodiments of the inventive concepts are not limited to the present example. For example, according to at least one example embodiment of the inventive concepts, the resistance values of the first and the second feedback resistors R1 and R2 shown in FIG. 2 and the resistance values of the first to third resistance elements RRIFB1 to RRIFB2 may be determined or, alternatively, predetermined so that the virtual resistance value of the ESR component ESR satisfies the condition indicated by Equation 1.

In FIG. 4, the ripple injection voltage VINJ is incapable of being generated by the configuration of the reverse phase voltage generation circuit 110, because the first and second switching control signals SWCS1 and SWCS2 are inactive under a DCM condition. The DCM reference voltage generation circuit 140 may be connected to the first stage circuit 120 through the third switch element SW1 based on the high level sensing signal ZCS in a DCM operation. In order for the voltage converter 1 to smoothly transition from the DCM operation to a CCM operation, the DCM reference voltage VDCM_REF generated by the DCM reference voltage generation circuit 140 should be equal to or approximate to the DC component VINJ_DC of the ripple injection voltage VINJ in the CCM operation.

The DC component VINJ_DC may be defined by Equation 6.

$$VINJ\_DC = VOUT \times D \times \frac{RRIFB2}{RRIFB1 + RRIFB2}$$

The DC component VINJ_DC may be defined as a product of the output voltage VOUT, the duty ratio D of the reverse phase voltage VRV, and resistance values of the first to third resistance elements RRIFB1 to RRIFB2, and an ideal duty ratio D_IDEAL may be defined by the following Equation 7 assuming an ideal switching operation in the reverse phase voltage generation circuit 110.

$$D\_IDEAL = \frac{VOUT - VIN}{VOUT}$$

Using Equation 6 and Equation 7, the DC component VINJ_DC may be defined as Equation 8.

$$\text{VINJ\_DC} = VOUT \times \frac{VOUT - VIN}{VOUT} \times \frac{RRIFB2}{RRIFB1 + RRIFB2} = \quad \text{[Equation 8]}$$
$$(VOUT - VIN) \times \frac{RRIFB2}{RRIFB1 + RRIFB2}$$

The DC component VINJ_DC may be defined as a product of a difference between the output voltage VOUT and the input voltage VIN and resistance values of the first to third resistance elements RRIFB1 to RRIFB2. That is, the DC component VINJ_DC may be adjusted by the difference between the output voltage VOUT and the input voltage VIN, because the resistance values of the first to third resistance elements RRIFB1 to RRIFB2 are fixed values.

Referring to FIG. 6, the DCM reference voltage generation circuit 140 may include fifth and sixth resistor elements RREF1 and RREF2, a third capacitor CREF, first to fifth PMOS transistors TR1 to TR5, first and second current sources IS1 and IS2, and an amplifier AMP. The DCM reference voltage generation circuit 140 may receive the output voltage VOUT and the input voltage VIN, respectively, and the first to fifth PMOS transistors TR1 to TR5 may operate as a differential amplification circuit having a common gate structure. The first and second current sources IS1 and IS2 may have the same or approximate bias current IBIAS, respectively. The DCM reference voltage generation circuit 140 may form the internal voltage VX at the fourth internal node N4 the same or approximate to the input voltage VIN, allow the current corresponding to $$\frac{VOUT - VIN}{RREF1}$$

to flow through the fifth resistor element RREF1, and as a result, generate the DCM reference voltage VDCM_REF expressed as Equation 9.

$$\text{VDCM\_REF} = (VOUT - VIN) \times \frac{RREF2}{RREF1} \quad \text{[Equation 9]}$$

The DCM reference voltage generation circuit 140 may generate the DCM reference voltage VDCM_REF to be equal to or approximate to VDCM_REF according to Equation 8. Accordingly, the resistance values of the fifth and sixth resistance elements RREF1 and RREF2 may be determined or, alternatively, predetermined as shown in Equation 10.

$$\frac{RREF2}{RREF1} \approx \frac{RRIFB2}{RRIFB1 + RRIFB2} \quad \text{[Equation 10]}$$

In summary, the ripple injection circuit 100 may generate a ripple injection voltage VINJ and a DC component VINJ_DC through the switching operation of the reverse phase voltage generation circuit 110, the first and second stage circuits 120 and 130 during the CCM operation, and generate a DC component VINJ_DC that is the same or approximate as in the CCM operation through the DCM reference voltage generation circuit 140 during the DCM operation.

Moreover, one or more example embodiments of the inventive concepts are not limited to the examples illustrated in FIGS. 4 and 6. For example, at least one example embodiments of the inventive concepts may be implemented with various configurations for generating a ripple injection voltage VINJ having the same phase as the phase as the inductor current IL and a DC component VINJ_DC of the ripple injection voltage VINJ.

Figure 7:
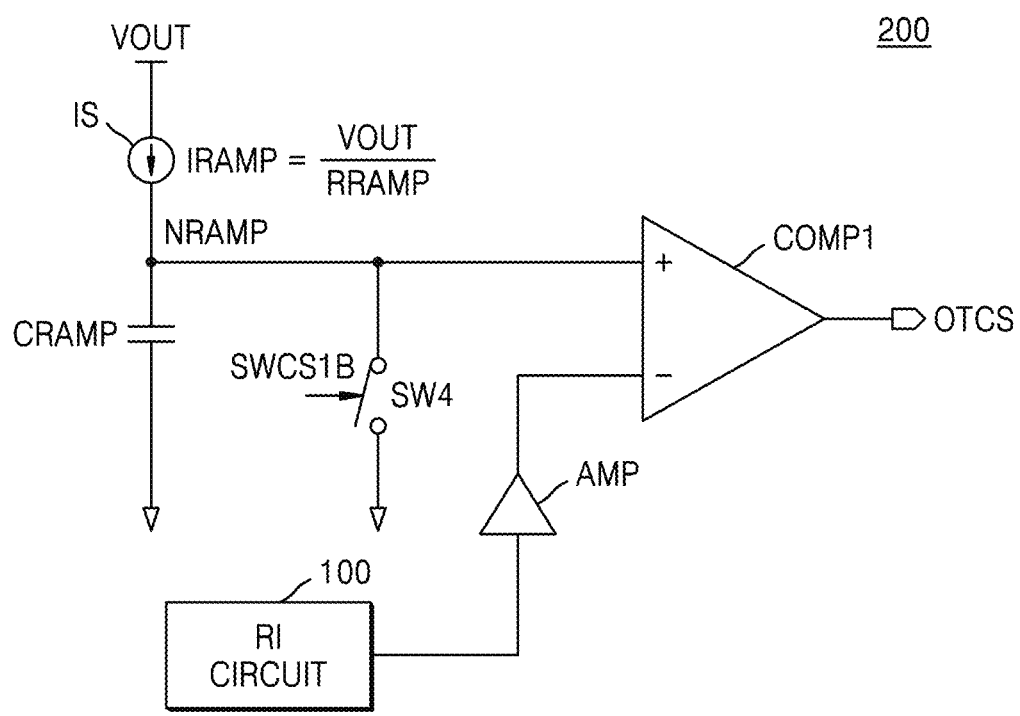
FIG. 7 is a diagram illustrating an on-time control circuit of FIG. 2 according to at least one example embodiment of the inventive concepts.
Figure 8:
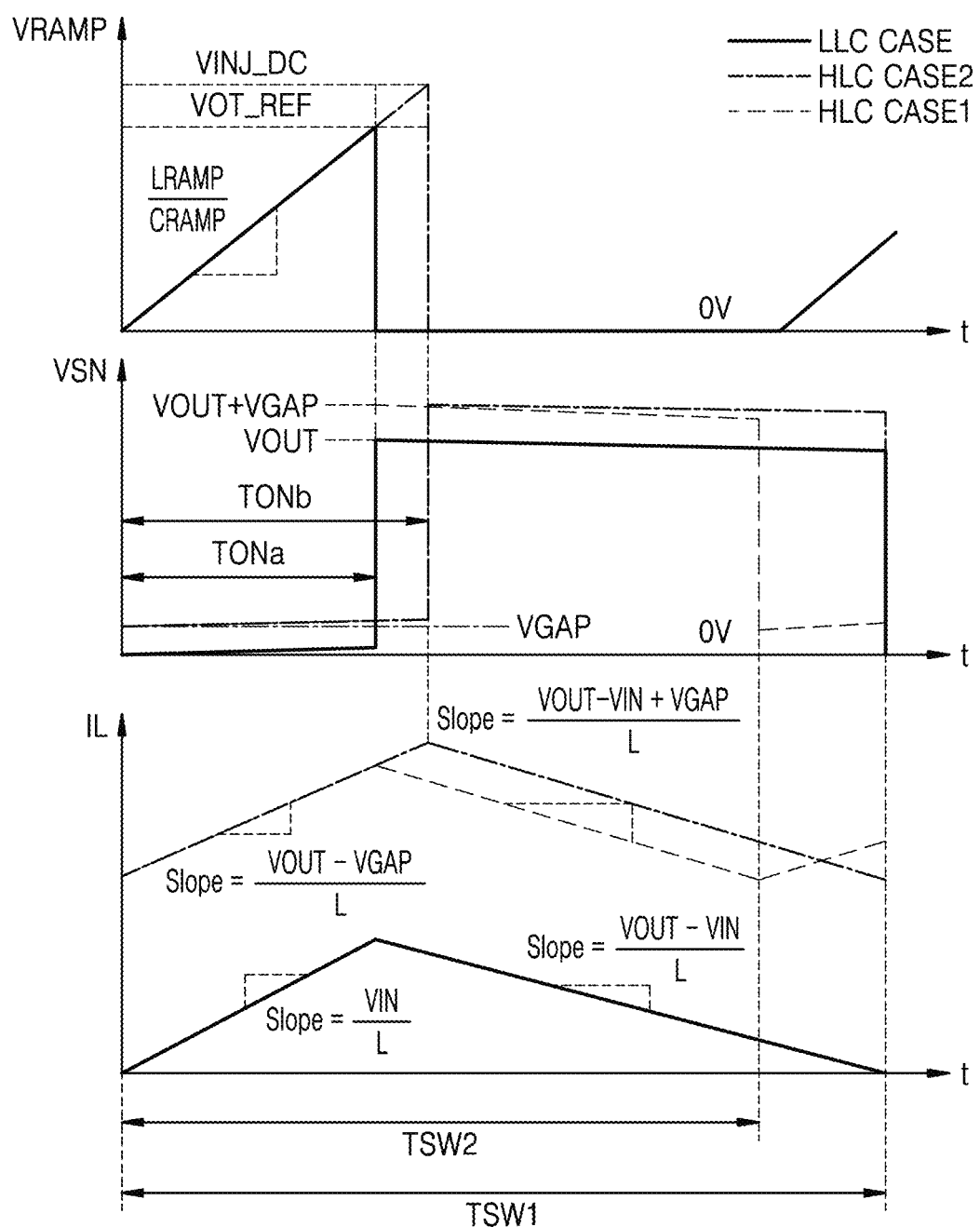
FIG. 8 is a graph for explaining changes in lamp voltage, switching node voltage, and inductor current when an on-time control operation is performed, according to at least one example embodiment of the inventive concepts.
Figure 9:
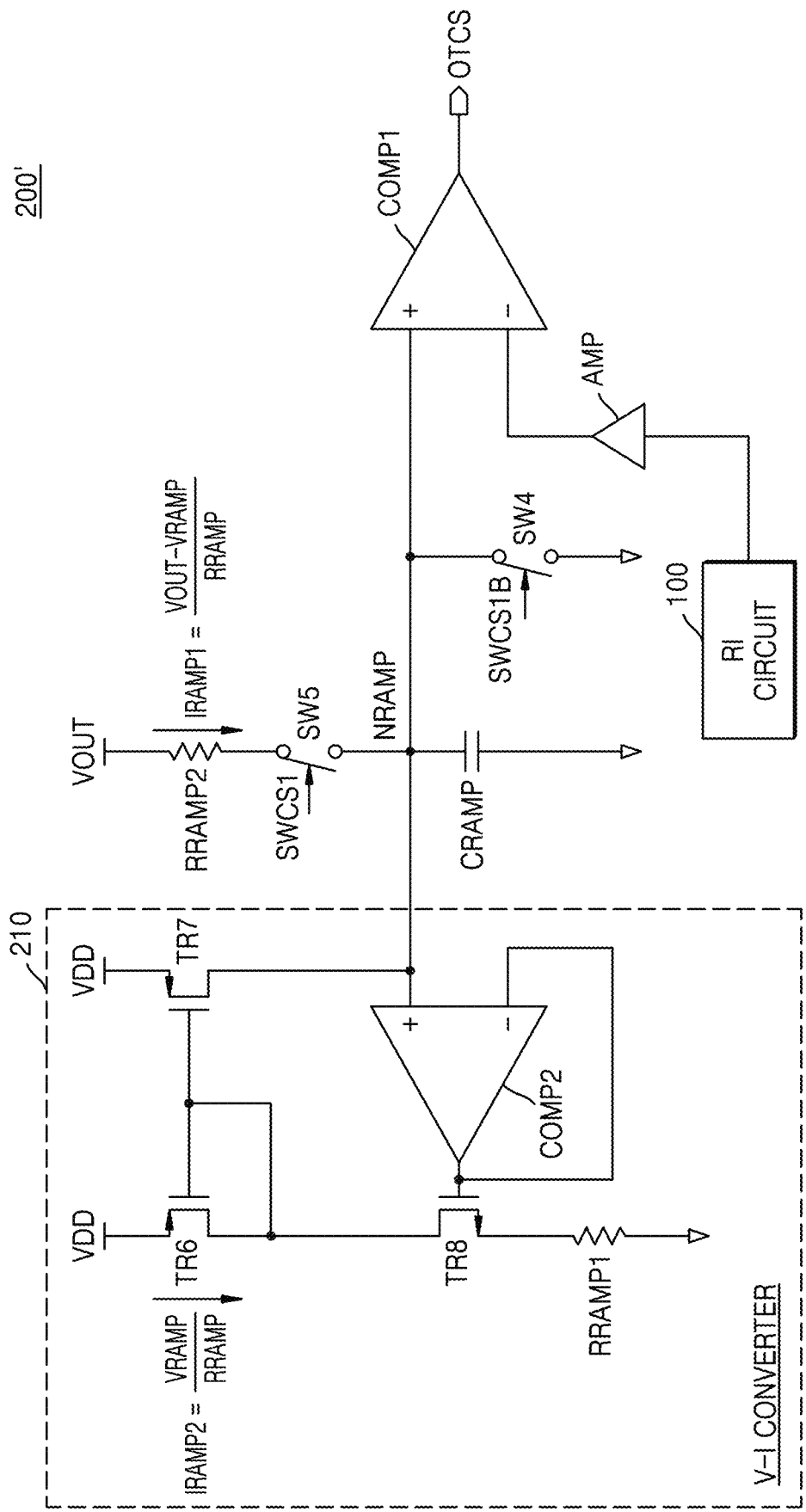
FIG. 9 is a diagram specifically illustrating the on-time control circuit of FIG. 2

FIG. 7 is a diagram illustrating an on-time control circuit of FIG. 2 according to at least one example embodiment of the inventive concepts, FIG. 8 is a graph for explaining changes in lamp voltage, the switching node voltage, and inductor current when an on-time control operation is performed, according to at least one example embodiment of the inventive concepts, and FIG. 9 is a diagram specifically illustrating the on-time control circuit of FIG. 2.

Referring to FIG. 7, the on-time control circuit 200 may include a current source IS, a lamp capacitor CRAMP, a sixth switch element SW4, an amplifier AMP, and a first comparator COMP1. The lamp capacitor CRAMP may be connected between the lamp node NRAMP and the ground voltage, and the sixth switch element SW4 may be connected in parallel with the lamp capacitor CRAMP between the lamp node NRAMP and the ground voltage. The sixth switch element SW4 may receive the inverted first switching control signal SWCS1B. A lamp current IRAMP having a size in which the output voltage VOUT is divided by a lamp resistance RRAMP flows through the current source IS, and the configuration related to the current source IS is described in detail in FIG. 9. The first comparator COMP1 may receive the voltage (hereinafter, the lamp voltage) of the lamp node NRAMP generated from the output voltage VOUT and the DC component VINJ_DC of the ripple injection voltage which is generated by the ripple injection circuit 100 and amplified by the amplifier AMP. The first comparator COMP1 compares the lamp voltage with the DC component VINJ_DC to generate an on-time control signal OTCS for performing a voltage conversion operation in an on-time control method based on a result of the comparison. Moreover, the switching frequency of the voltage converter including the on-time control circuit 200 may be defined as Equation 11.

$$FSW = \frac{1}{TON} \times D \quad \text{[Equation 11]}$$

The switching frequency FSW of the voltage converter may be defined as a product of the duty ratio D of the reverse phase voltage VRV of FIG. 5 and an on-time TON according to the on-time control signal OTCS. On the other hand, the duty ratio D may be variable depending on the input voltage, output voltage, load current, etc. of the voltage converter, and the on-time TON may be set to be proportional to the duty ratio D in order to keep the switching frequency FSW constant even with changes in the input voltage, output voltage, load current, and the like. The on-time TON may be defined as Equation 12.

$$TON = \quad \text{[Equation 12]}$$
$$\frac{CRAMP}{IRAMP} \times \text{VINJ\_DC} = RRAMP \times CRAMP \times \frac{\text{VINJ\_DC}}{VOUT} =$$

-continued $$RRAMP \times CRAMP \times D \times \frac{RRIFB2}{RRIFB1 + RRIFB2}$$

In summary, when Equation 6 defining the DC component VINJ_DC is applied to Equation 12 defining the on-time TON, the on-time TON may be proportional to the duty ratio D. Moreover, as described above, the duty ratio of the reverse phase voltage VRV has a certain relationship with the duty ratio of the switching node voltage VSN (for example, the duty ratio D of the reverse phase voltage VRV=1—the duty ratio of the switching node voltage VSN). Accordingly, TON may be based on the duty ratio of the switching node voltage VSN. The switching frequency FSW according to at least one example embodiment of the inventive concepts may be defined as Equation 13.

$$FSW = \frac{1}{RRAMP \times CRAMP \times D \times \frac{RRIFB2}{RRIFB1 + RRIFB2}} \times D = \quad \text{[Equation 13]}$$

$$= \frac{1}{RRAMP \times CRAMP \times \frac{RRIFB2}{RRIFB1 + RRIFB2}}$$

The switching frequency FSW may be defined as the lamp resistance RRAMP, resistance values of the first to third resistance elements RRIFB1 to RRIFB2, and a capacitance of the lamp capacitor CRAMP. The switching frequency FSW may be fixed, because the resistance values and the capacitance are fixed values.

FIG. 8 shows a graph of a lamp voltage VRAMP, a switching node voltage VSN, and an inductor current IL according to a light load current case (LLC CASE), a first heavy load current case (HLC CASE1) to which a conventional technique is applied, and a second high load current region case (HLC CASE2) to which at least one example embodiment of the inventive concepts is applied. Moreover, as described above, the voltage converter according to at least one example embodiment of the inventive concepts is presumed to perform the operation in the DCM mode in the low load current region and to perform the operation in the CCM mode in the high load current region.

Referring to FIG. 8, in the low load current region case (LLC CASE), the inductor may be charged until on-time TONa corresponding to a time when the level of the ramp voltage VRAMP becomes equal to the level of the on-time reference voltage VOT_REF. The lamp voltage VRAMP may have a slope of $$\frac{IRAMP}{CRAMP}$$

(lamp current IRAMP and capacitance of the lamp capacitor CRAMP). Accordingly, the inductor current IL rises with the slope of $$\frac{VIN}{L}$$

(input voltage VIN and inductance of the inductor L) during on-time TONa, and the switching node voltage VSN may maintain a low level state. Subsequently, after the on-time TONa, the ramp voltage VRAMP may remain low during the off-time, the inductor current IL may decrease with the slope of $$\frac{VOUT - VIN}{L}$$

(output voltage VOUT, input voltage VIN and inductance of the inductor L), and the switching node voltage VSN may maintain a high level state to have the same magnitude as the output voltage VOUT. In the low load current region case LLC CASE, the voltage converter may have a first switching period (TSW1).

In the first high load current region case HLC CASE1, the inductor may be charged to the on-time TONa corresponding to the time when the level of the lamp voltage VRAMP is equal to the level of the on-time reference voltage VOT_REF That is, conventionally, the charging time of the inductor may be the same as the low load current region case LLC CASE, because the on-time TONa is determined using a fixed on-time reference voltage VOT_REF. On the other hand, in the first high load current region case HLC CASE1, the switching node voltage VSN is raised by a desired or, alternatively, predetermined gap VGAP. Thus, a sufficient inductor current IL is incapable of being secured during the on-time TONa, because the inductor current IL rises with the slope of $$\frac{VIN - VGAP}{L}$$

(input voltage VIN, inductance of the inductor L, gap VGAP) in the on-time TONa period. During the off-time, the inductor current IL falls with the slope of $$\frac{VOUT - VIN + VGAP}{L}$$

(output voltage VOUT, input voltage VIN, inductance of the inductor L, gap VGAP), and as a result, the voltage converter has a second switching period TSW2 in the first high load current region case HLC CASE1. In summary, conventionally, when switching from the low load current region case LLC CASE to the first high load current region case HLC CASE1, the switching cycle is changed from the first switching cycle TSW1 to the second switching cycle TSW2. As a result, there is a problem that a switching frequency is variable due to a change in an output voltage VOUT.

In the second high load current region case HLC CASE2 according to at least one example embodiment of the inventive concepts of the present disclosure, the DC component VINJ_DC of the ripple injection voltage may be variable according to the output voltage VOUT, as shown in Equation 8, and an on-time (TONb) in response to a change in the output voltage VOUT may be determined using the DC component VINJ_DC. Accordingly, the inductor current IL rises with a slope of $$\frac{VIN - VGAP}{L}$$

(input voltage VIN, inductance of the inductor L, gap VGAP) for an on-time TONb longer than the on-time TONa of the low load current region case LLC CASE, so that sufficient inductor current IL may be secured, as a result, the voltage converter may have the first switching cycle TSW1 in the second high load current region case HLC CASE2. Therefore, the voltage converter according to at least one example embodiment of the inventive concepts of the present disclosure may have a fixed switching frequency when switching from a low load current region to a high load current region or a high load current region to a low load current region, thereby performing a stable voltage conversion operation.

Referring to FIG. 9, compared to the on-time control circuit 200 shown in FIG. 7, the on-time control circuit 200' may include a voltage-current converter 210, a first lamp resistor RRAMP1 and a seventh switch element SW5, instead of the current source IS. The voltage-current converter 210 may include sixth and seventh PMOS transistors TR6 and TR7, an NMOS transistor TR8, a second comparator COMP2, and a second lamp resistor RRAMP2. Sources of the sixth and seventh PMOS transistors TR6 and TR7 are respectively connected to the power supply voltage VDD, and the respective gates may be interconnected. The drain of the sixth PMOS transistor TR6 may be connected to the drain of the NMOS transistor TR8, and the drain of the seventh PMOS transistor TR7 may be connected to the second comparator COMP2. The output of the second comparator COMP2 may be input to the second comparator COMP2 as feedback. The second lamp resistor RRAMP2 may be connected between the NMOS transistor TR8 and the ground voltage.

According to the configuration of the voltage-to-current converter 210, a second lamp current IRAMP2 having a value of $$\frac{VRAMP}{RRAMP}$$

(the lamp voltage VRAMP of the lamp node NRAMP and the resistance value of the lamp resistor RRAMP) may flow through the sixth PMOS transistor TR6.

On the other hand, the inverted first switching control signal SWCS1B is received by the sixth switch element SW4 and the first switching control signal SWCS1 is received by the seventh switch element SW5, so that a first lamp current IRAMP1 having a value of $$\frac{VOUT - VRAMP}{RRAMP}$$

(output voltage VOUT, lamp voltage VRAMP of the lamp node NRAMP, and resistance value of the lamp resistance RRAMP) may flow through the first lamp resistor RRAMP1. As a result, the on-time control circuit 200' may generate an on-time control signal OTCS for setting an on-time period that is variable by a change in the output voltage VOUT using the sum of a first lamp current IRAMP1 and a second lamp current IRAMP2.

However, one or more example embodiments of the inventive concepts are not limited to the configuration illustrated in FIGS. 7 and 9. For example, the on-time control circuits 200 and 200' may be implemented in various configurations capable of generating an on-time control signal OTCS for setting an on-time period that varies according to a change in the output voltage VOUT.

Figure 10:
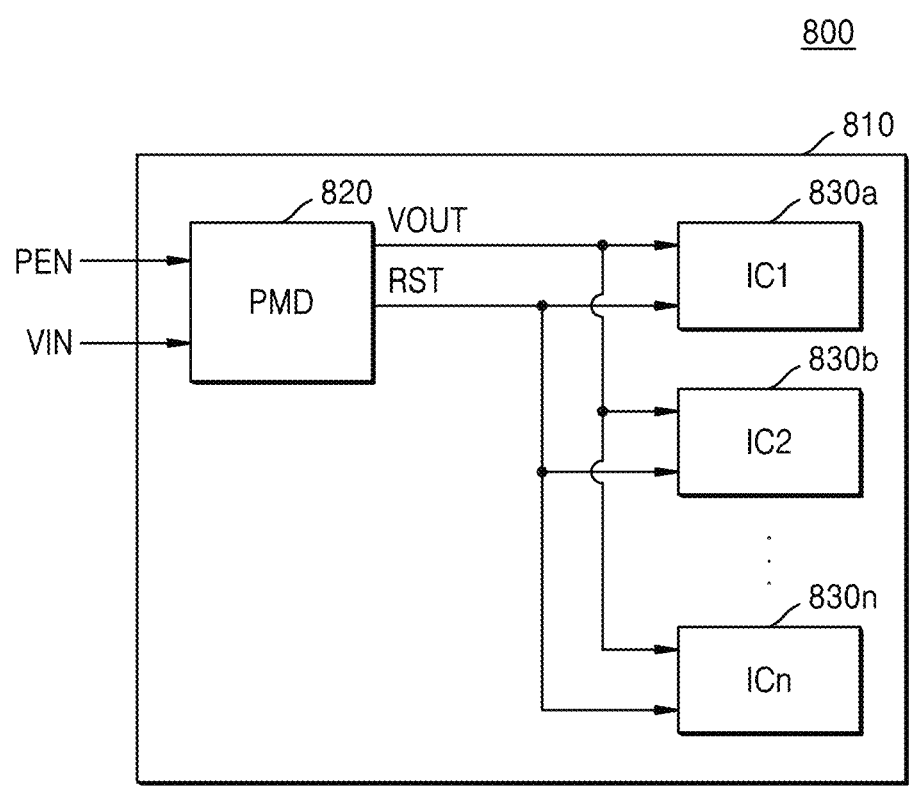
FIG. 10 is a block diagram showing a power management system including a power management device according to at least one example embodiment of the inventive concepts.

FIG. 10 is a block diagram showing a power management system including a power management device according to at least one example embodiment of the inventive concepts.

Referring to FIG. 10, a power management system 800 may include a power management device 820 mounted on a printed circuit board 810 and a plurality of integrated circuits 630a to 630n. The power management device 820 may be the power management device (PMD) shown in FIG. 1. The power management device 820 may generate an output voltage VOUT based on the input voltage VIN and a reset signal RST based on the power enable signal PEN. The power management device 820 may include the voltage converter 1 shown in FIG. 1 and the like. The voltage converter of the power management device 820 may adjust a feedback voltage required to generate a switching control signal according to the above-described example embodiments based on a state of an inductor current, and generate an on-time control signal that enables the voltage converter to have a fixed switching frequency even in a DCM mode-CCM mode mutual conversion (or a low load current region-high load current region mutual conversion).

The plurality of integrated circuits 830a to 830n may maintain a reset state until an output voltage VOUT reaches a normal state based on a reset signal RST, release the reset state after the output voltage VOUT reaches the normal state and be driven based on the output voltage VOUT.

Figure 11:
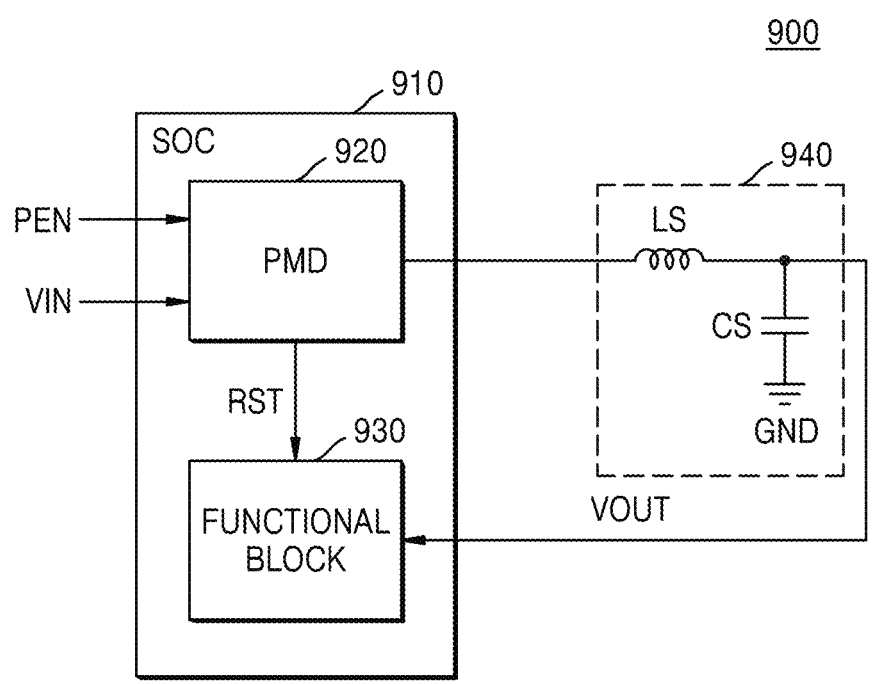
FIG. 11 is a block diagram showing another example of a power management system including a power management device according to at least one example embodiment of the inventive concepts.

FIG. 11 is a block diagram showing another example of a power management system including a power management device according to at least one example embodiment of the inventive concepts.

Referring to FIG. 11, the power management system 900 may include a system on chip 910 and a filter 940. The system on chip 910 may include a power management device 920 and a functional block 930.

The voltage converter of the power management device 920 may adjust a feedback voltage required to generate a switching control signal according to the above-described example embodiments based on a state of an inductor current, and generate an on-time control signal that enables the voltage converter to have a fixed switching frequency even in a DCM mode-CCM mode mutual conversion (or a low load current region-high load current region mutual conversion).

The filter 930 may be a low pass filter including an inductor LS and a capacitor CS. The functional block 930 may maintain a reset state until an output voltage VOUT reaches a normal state based on a reset signal RST, release the reset state after the output voltage VOUT reaches the normal state and be driven based on the output voltage VOUT.

Figure 12:
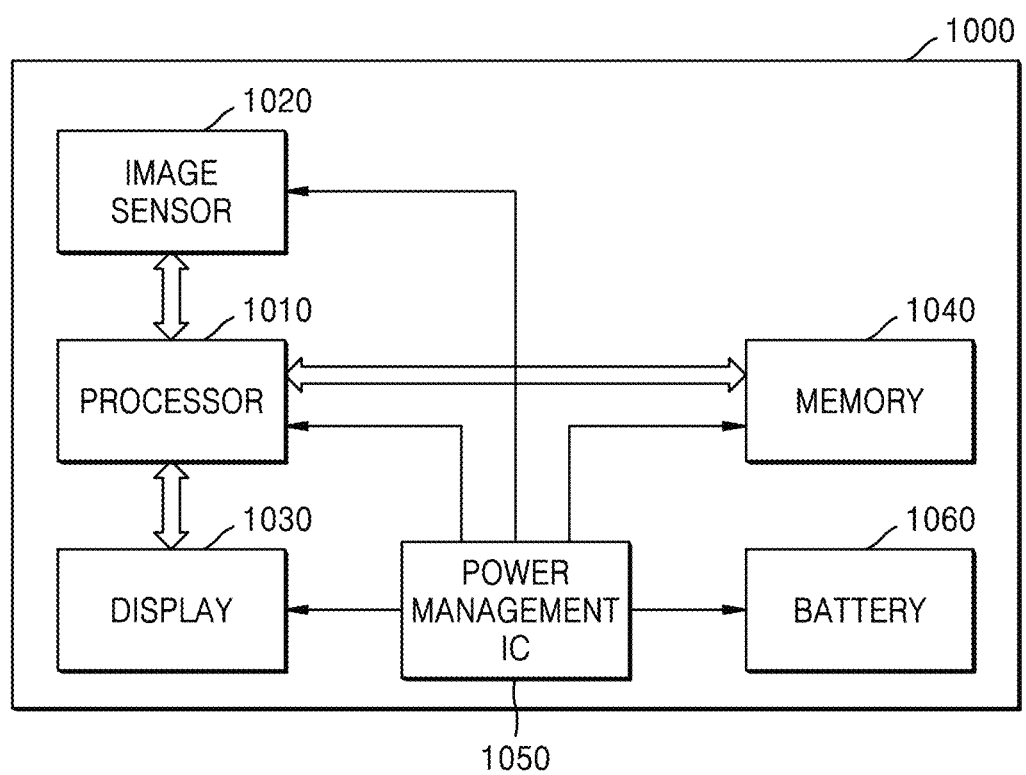
FIG. 12 is a block diagram illustrating an electronic device including a voltage converter according to at least one example embodiment of the inventive concepts.

FIG. 12 is a block diagram illustrating an electronic device including a voltage converter according to at least one example embodiment of the inventive concepts.

Referring to FIG. 12, an electronic device 1000 that may be implemented as a data processing device may include a power management integrated circuit 1050 and a battery 1060. Examples of the data processing device may include a personal computer (PC), a tablet computer, a netbook, an e-reader, a personal digital assistant (PDA), a portable multimedia player (PMP), an MP3 player, and an MP4 player.

The power management integrated circuit 1050 may receive power from the battery 1060 and manage power of a processor 1010, an image sensor 1020, a display 1030, or a memory 1040. The power management integrated circuit 1050 may include the voltage converter 1 shown in FIG. 1 and the like. Thus, the voltage converter of the power management integrated circuit 1050 may adjust the feedback voltage required to generate the switching control signal based on the state of the inductor current according to the above-described example embodiments, and generate an on-time control signal that enables the voltage converter to have a fixed switching frequency even in mutual conversion between DCM mode and CCM mode (or a low load current region-high load current region mutual conversion).

An image sensor 1020 of the electronic device 1000 converts an optical signal into a digital signal, and the converted digital signal is stored in the memory 1040 under the control of the processor 1010 or displayed through the display 1030. In addition, the digital signal stored in the memory 1040 is displayed through the display 1030 under the control of the processor 1010.

Example embodiments of the inventive concepts having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:

1. A voltage converter comprising:
a converting circuit comprising an inductor and a plurality of first switch elements connected to the inductor through a switching node to charge or discharge the inductor;
an output circuit configured to provide an output voltage to a load based on a voltage received from the converting circuit; and
a switching control circuit configured to provide a plurality of switching control signals to the plurality of first switch elements;
wherein the switching control circuit comprises:
a ripple injection circuit configured to generate a direct current (DC) component of a ripple injection voltage that has a same phase as a current of the inductor, the DC component of the ripple injection voltage being proportional to a duty ratio of a reverse phase voltage to a voltage of the switching node; and
an on-time control circuit configured to generate an on-time control signal for controlling a charging time of the inductor based on the DC component.

2. The voltage converter of claim 1, wherein the switching control circuit further comprises,
a comparator configured to compare a voltage obtained by adding a voltage obtained by removing the DC component from the ripple injection voltage to a feedback voltage corresponding to the output voltage with a reference voltage, and generate a comparison result signal.

3. The voltage converter of claim 2, wherein the switching control circuit is configured to,
generate the plurality of switching control signals based on the on-time control signal and the comparison result signal.

4. The voltage converter of claim 2, wherein the output circuit comprises,
a plurality of feedback resistor elements connected to each other through a feedback node through which the feedback voltage is output.

5. The voltage converter of claim 1, wherein the ripple injection circuit comprises, a reverse phase voltage generation circuit configured to generate the reverse phase voltage to the voltage of the switching node based on the output voltage in a continuous conduction mode (CCM);
a first stage circuit configured to generate the ripple injection voltage by first RC filtering the reverse phase voltage; and
a second stage circuit configured to generate the DC component by second RC filtering the ripple injection voltage.

6. The voltage converter of claim 5, wherein the reverse phase voltage generation circuit comprises,
a plurality of second switch elements and a plurality of first resistor elements configured to divide the output voltage by a preset ratio to generate the reverse phase voltage,
wherein the first stage circuit comprises,
a second resistor element and a capacitor for the first RC filtering.

7. The voltage converter of claim 6, resistance values of the plurality of first resistor elements, a resistance value of the second resistor element and a capacitance of the capacitor are preset so that the ripple injection voltage and the current of the inductor are in phase.

8. The voltage converter of claim 5, wherein the reverse phase voltage generation circuit further comprises,
a third switch element configured to transfer a discontinuous conduction mode (DCM) reference voltage to the first stage circuit in a DCM.

9. The voltage converter of claim 8, wherein the DCM reference voltage is preset to match the DC component in the CCM.

10. The voltage converter of claim 1, wherein the on-time control circuit comprises,
a comparator configured to generate the on-time control signal by comparing a ramp voltage generated based on the output voltage and the DC component.

11. The voltage converter of claim 10, wherein the on-time control circuit further comprises,
a second switch element configured to selectively provide a ground voltage instead of the ramp voltage to the comparator.

12. The voltage converter of claim 10, wherein the on-time control circuit further comprises,
an amplifier configured to amplify the DC component and provide an amplified DC component to the comparator.

13. The voltage converter of claim 12, wherein the on-time control signal corresponds to a signal for controlling an on-time period so that a length of the on-time period for charging the inductor matches a duty ratio of the voltage of the switching node.

14. The voltage converter of claim 1, wherein the first switch elements comprises,
an n-channel power switch element connected between the switching node and a ground voltage; and
a p-channel power switch element connected between the switching node and an output node of the converting circuit.

15. A power management system comprising:
a power management device configured to generate an output voltage based on an input voltage and generate a reset signal based on a power enable signal; and
a plurality of integrated circuits configured to operate in a reset state based on the reset signal until the output voltage reaches a normal state and to be driven based on the output voltage after the output voltage reaches the normal state, wherein the power management device comprises,
a voltage converter configured to operate based on a fixed switching frequency to have a change below a threshold in DCM-CCM mutual conversion,
the voltage converter including a ripple injection circuit configured to generate a direct current (DC) component of a ripple injection voltage that has a same phase as a current of an inductor, the DC component of the ripple injection voltage being proportional to a duty ratio of a reverse phase voltage to a voltage of a switching node.

16. The power management system of claim 15, wherein the voltage converter comprises,
a converting circuit comprising the inductor and a plurality of switch elements; and
a switching control circuit configured to provide a plurality of switching control signals to the plurality of switch elements,
wherein the switching control circuit comprises,
the ripple injection circuit configured to generate the direct current (DC) component of the ripple injection voltage that has the same phase as the current of the inductor; and
an on-time control circuit configured to generate an on-time control signal for controlling a charging time of the inductor based on the DC component.

17. The power management system of claim 16, wherein the switching control circuit further comprises,
a comparator configured to compare a voltage obtained by adding a voltage obtained by removing the DC component from the ripple injection voltage to a feedback voltage corresponding to the output voltage with a reference voltage, and generate a comparison result signal.

18. The power management system of claim 16, wherein an on-time period in which the inductor is charged by the on-time control signal is proportional to the duty ratio of the reverse phase voltage to the voltage of the switching node to which the inductor and the plurality of switch elements are connected in the converting circuit.

19. The power management system of claim 16, wherein the voltage converter further comprises,
an output circuit configured to provide an output voltage to a load based on a voltage received from the converting circuit, and to provide a feedback voltage corresponding to the output voltage to the switching control circuit,
wherein the switching control circuit is configured to,
adjust the feedback voltage based on a state of a current of the inductor and generate the plurality of switching control signals based on an adjusted feedback voltage.

20. A voltage converter comprising:
a converting circuit comprising an inductor connected to a switching node, a first switch element connected between the switching node and a ground voltage, and a second switch element connected between the switching node and an output node;
an output circuit configured to provide an output voltage to a load based on a voltage received from the output node; and
a switching control circuit configured to provide a first and second switching control signals to the first and second switch elements,
wherein the switching control circuit comprises,
a ripple injection circuit configured to generate a ripple injection voltage having a same phase as the inductor current and generate a direct current (DC) component of the ripple injection voltage, the DC component of the ripple injection voltage being proportional to a duty ratio of a reverse phase voltage to a voltage of the switching node; and
an on-time control circuit configured to receive the DC component of the ripple injection voltage and generate an on-time control signal based on the received DC component,
wherein the switching control circuit is configured to,
generate the first and second switching control signals based on a feedback voltage received from the output circuit, the ripple injection voltage, the DC component and a sensing signal for a current of the inductor.

* * * * *